(12) United States Patent
Oh et al.

(10) Patent No.: US 10,748,846 B2
(45) Date of Patent: Aug. 18, 2020

(54) SEMICONDUCTOR DEVICE

(71) Applicant: SAMSUNG ELECTRONICS CO., LTD., Suwon-si, Gyeonggi-Do (KR)

(72) Inventors: Se-Il Oh, Suwon-si (KR); Jung-Ha Oh, Jeonju-si (KR); Hyuck-Joon Kwon, Yongin-si (KR); Jong-Hyuk Kim, Hwaseong-si (KR); Jong-Moon Yoon, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/582,706

(22) Filed: Sep. 25, 2019

(65) Prior Publication Data
US 2020/0144176 A1  May 7, 2020

Related U.S. Application Data

(63) Continuation of application No. 15/674,878, filed on Aug. 11, 2017, now Pat. No. 10,438,886.

(30) Foreign Application Priority Data

Dec. 15, 2016 (KR) .......................... 10-2016-0172010

(51) Int. Cl.
*H01L 23/522* (2006.01)
*H01L 23/14* (2006.01)
(Continued)

(52) U.S. Cl.
CPC ........ *H01L 23/5223* (2013.01); *H01L 23/147* (2013.01); *H01L 23/485* (2013.01);
(Continued)

(58) Field of Classification Search
CPC ......... H01L 2924/00; H01L 2924/0002; H01L 23/5223; H01L 27/10894; H01L 27/10852; H01L 28/40
USPC ... 257/296, 532, E21.008, E21.66, E27.048, 257/306, E21.648, E27.088; 438/396, 438/253, 239
See application file for complete search history.

(56) References Cited

U.S. PATENT DOCUMENTS 6,552,433 B1   4/2003 Chou et al.
6,570,210 B1 * 5/2003 Sowlati .................. H01L 28/82
                                                                257/303

(Continued)

FOREIGN PATENT DOCUMENTS

JP    2002-270771    9/2002
JP    2007-012646    1/2007
JP    2012-033760    2/2012

*Primary Examiner* — Jonathan Han
(74) *Attorney, Agent, or Firm* — F. Chau & Associates, LLC

(57) ABSTRACT

A semiconductor device may include an insulating layer, a pad, a circuit, at least one first wiring, at least one second wiring, at least one third wiring, and a pad contact. The pad may be disposed on the insulating layer. The circuit may be disposed in the insulating layer. The circuit may be positioned below the pad. The first wiring may be disposed between the pad and the circuit. The second wiring may be disposed between the pad and the first wiring. The third wiring may be disposed between the pad and the second wiring. The pad contact may be configured to directly connect the pad to the circuit.

13 Claims, 11 Drawing Sheets

(51) Int. Cl.
*H01L 23/482* (2006.01)
*H01L 23/532* (2006.01)
*H01L 23/485* (2006.01)
*H01L 49/02* (2006.01)
*H01L 23/00* (2006.01)
*H01L 23/58* (2006.01)

(52) U.S. Cl.
CPC ...... *H01L 23/4824* (2013.01); *H01L 23/5222* (2013.01); *H01L 23/53295* (2013.01); *H01L 23/585* (2013.01); *H01L 24/00* (2013.01); *H01L 28/87* (2013.01)

(56) References Cited

U.S. PATENT DOCUMENTS

| | | | |
|---|---|---|---|
| 6,743,671 B2 * | 6/2004 | Hu | H01L 23/5225 257/307 |
| 7,141,885 B2 | 11/2006 | Kim | |
| 7,755,195 B2 * | 7/2010 | Ueda | H01L 24/05 257/758 |
| 8,261,229 B2 * | 9/2012 | Hart | H01L 23/556 716/137 |
| 9,006,099 B2 | 4/2015 | Anderson et al. | |
| 9,257,499 B2 | 2/2016 | Pagani | |
| 2008/0230820 A1 | 9/2008 | Maeda et al. | |
| 2009/0180257 A1 * | 7/2009 | Park | H01L 23/64 361/709 |
| 2009/0230507 A1 * | 9/2009 | Riess | H01L 23/5223 257/532 |
| 2014/0332872 A1 | 11/2014 | Kim | |
| 2018/0174958 A1 | 6/2018 | Oh et al. | |

* cited by examiner

SEMICONDUCTOR DEVICE

CROSS-REFERENCE TO RELATED APPLICATION

This application claims is a continuation of U.S. application Ser. No. 15/674,878, filed on Aug. 11, 2017 in the U.S. Patent and Trademark Office, which claims priority under 35 U.S.C. § 119 to Korean Patent Application No. 10-2016-0172010, filed on Dec. 15, 2016 in the Korean Intellectual Property Office, the disclosure of which is incorporated by reference herein in its entirety.

TECHNICAL FIELD

Exemplary embodiments of the present inventive concept relate to a semiconductor device.

DISCUSSION OF RELATED ART

A semiconductor device may include an insulating layer, a pad, and a wiring. The insulating layer may be formed on a semiconductor substrate. The pad may be arranged on an upper surface of the insulating layer. The wiring may be arranged in the insulating layer. The wiring may be configured to electrically connect the pad with a circuit in the semiconductor substrate.

A ring pattern may be formed in the insulating layer below the pad. The ring pattern may be configured to surround the pad. Thus, the wiring might not be arranged in a portion of the insulating layer surrounded by the ring pattern. Accordingly, a power integrity and a signal integrity of the semiconductor device may deteriorate.

SUMMARY

Exemplary embodiments of the present inventive concept provide a semiconductor device having an increased power integrity and signal integrity.

Exemplary embodiments of the present inventive concept provide a semiconductor device. The semiconductor device includes an insulation layer, a pad, a circuit, at least one first wiring, at least one second wiring, at least one third wiring and a pad contact. The pad is disposed on the insulating layer. The circuit is disposed in the insulating layer. The circuit is disposed below the pad. The first wiring is disposed between the pad and the circuit. The second wiring is disposed between the pad and the first wiring. The third wiring is disposed between the pad and the second wiring. The pad contact is configured to directly connect the pad to the circuit.

Exemplary embodiments of the present inventive concept provide a semiconductor device. The semiconductor device includes an insulating layer, a pad, a circuit, at least one first wiring, at least one second wiring, at least one third wiring, a first power supply, and a second power supply. The pad is disposed on the insulating layer. The circuit is disposed in the insulating layer. The circuit is disposed below the pad. The first wirings may be disposed between the pad and the circuit. The second wirings may be disposed between the pad and the first wirings. The third wirings may be disposed between the pad and the second wirings. The first and second power supplies may supply different powers to adjacent metals included in the first to third wirings to form a metal-insulator-metal (MIM) capacitor.

Exemplary embodiments of the present inventive concept provide a semiconductor device. The semiconductor device includes an insulating layer, a pad, a circuit, first wirings, second wirings, third wirings, a first power supply, a second power supply, and a third power supply. The pad is disposed on the insulating layer. The circuit is disposed on the insulating layer. The circuit is spaced apart from the pad. The first wirings are disposed between the pad and the circuit. The second wirings are disposed between the pad and the first wirings. The third wirings are disposed between the pad and the second wirings. The first power supply and the second power supply are configured to supply power to the first to third wirings. The third power supply is configured to supply power to the first to third wirings. The third power supply is configured to supply a different power to the first wiring and the second wiring, or the second wiring and the third wiring.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

Exemplary embodiments of the present inventive concept will be described in more detail below with reference to the accompanying drawings.

Figure 1:
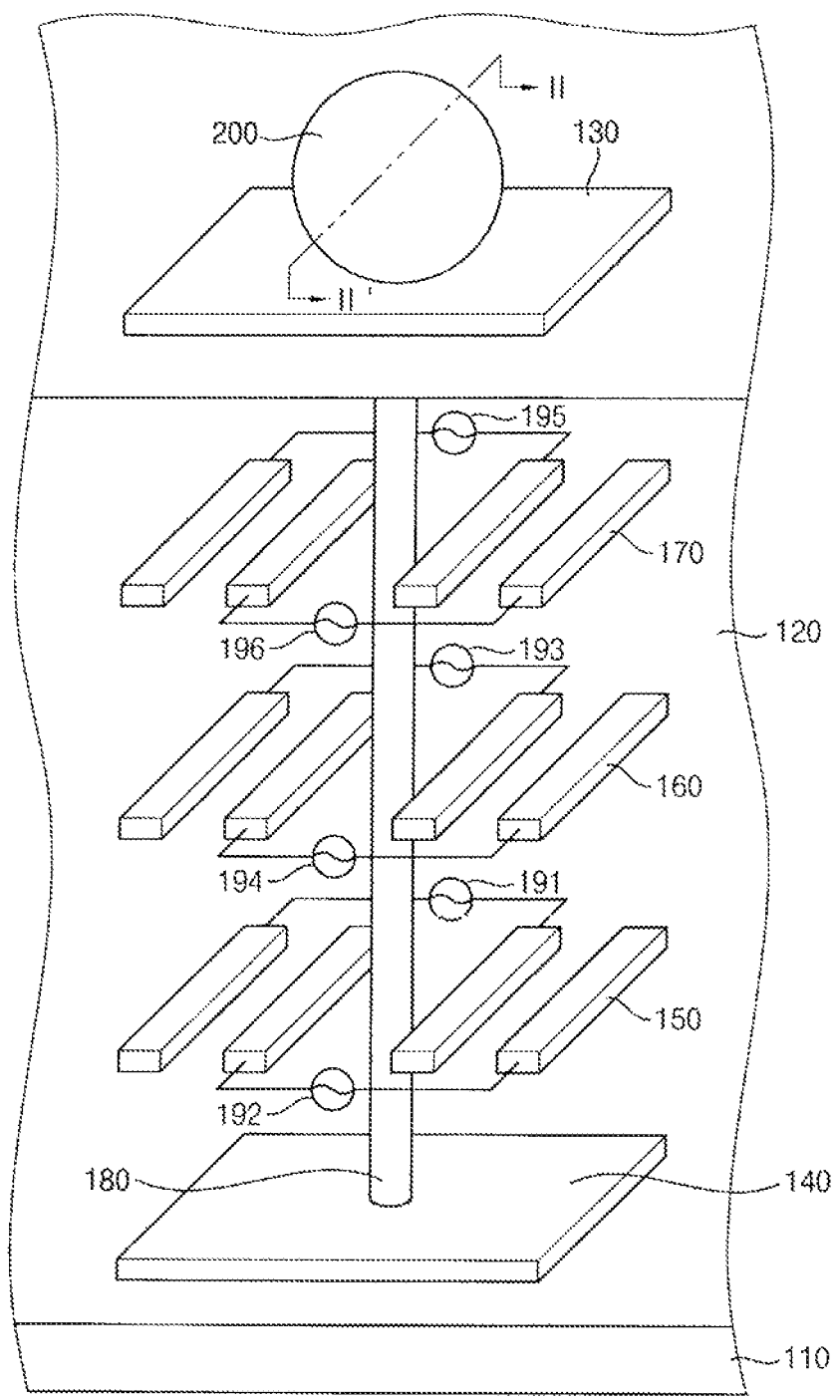
FIG. 1 is a perspective view illustrating a semiconductor device according to an exemplary embodiment of the present inventive concept.
Figure 2:
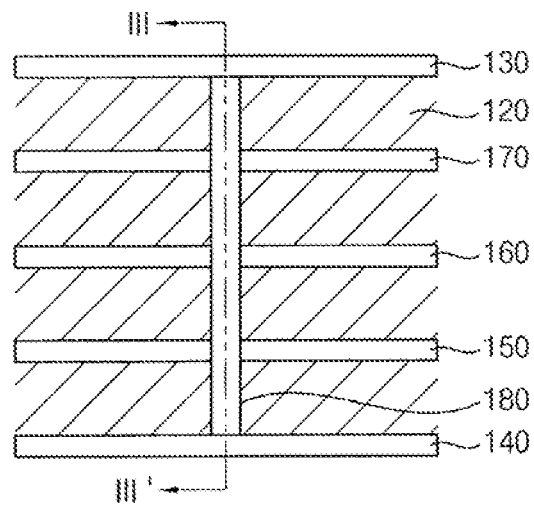
FIG. 2 is a cross-sectional view taken along a line II-II' of FIG. 1 according to an exemplary embodiment of the present inventive concept.
Figure 3:
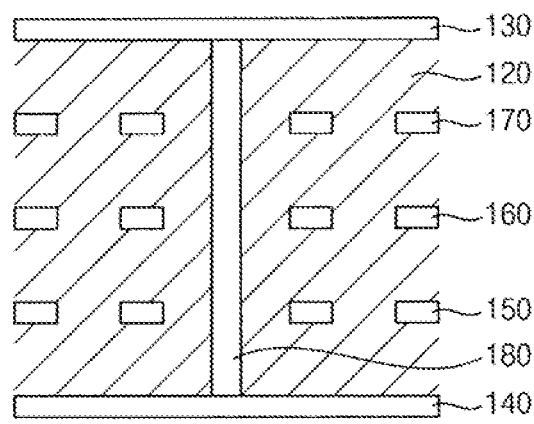
FIG. 3 is a cross-sectional view taken along a line III-III' of FIG. 2 according to an exemplary embodiment of the present inventive concept.

FIG. 1 is a perspective view illustrating a semiconductor device according to an exemplary embodiment of the present inventive concept. FIG. 2 is a cross-sectional view taken along a line II-II' of FIG. 1 according to an exemplary embodiment of the present inventive concept. FIG. 3 is a cross-sectional view taken along a line III-II' of FIG. 2 according to an exemplary embodiment of the present inventive concept.

Referring to FIGS. 1 to 3, a semiconductor device may include a semiconductor substrate 110, an insulating layer 120, a pad 130, a circuit 140, first wirings 150, second wirings 160, third wirings 170, a pad contact 180, first to sixth power supplies 191, 192, 193, 194, 195 and 196, and a conductive bump 200. The semiconductor device may include a DRAM device. Alternatively, the semiconductor device may include other memory devices.

The insulating layer 120 may be formed on an upper surface of the semiconductor substrate 110. The pad 130 may be arranged on an upper surface of the insulating layer 120. The pad 130 may include a metal. The pad 130 may have a rectangular shape. The conductive bump 200 may be disposed on the pad 130. The semiconductor device might not include a ring pattern configured to surround the pad 130.

The circuit 140 may be formed in the insulating layer 120. The circuit 140 may be positioned below the pad 130. The circuit 140 may be spaced apart from the pad 130, for example, in a vertical direction.

The first wirings 150 may be horizontally arranged between the circuit 140 and the pad 130. The first wirings 150 may be extended in a direction substantially parallel to a side surface of the pad 130. The first wirings 150 may include a metal. According to an exemplary embodiment of the present inventive concept, the first wirings 150 may include four metals. Alternatively, the first wirings 150 may include one to three metals or at least five metals.

The second wirings 160 may be horizontally arranged between the first wirings 150 and the pad 130. The second wirings 160 may extend in substantially the same direction of the first wirings 150. The second wirings 160 may include a metal. According to an exemplary embodiment of the present inventive concept, the second wirings 160 may include four metals. Alternatively, the second wirings 160 may include one to three metals or at least five metals.

The third wirings 170 may be horizontally arranged between the second wirings 160 and the pad 130. The third wirings 170 may extend in substantially the same direction of the first wirings 150. The third wirings 170 may include a metal. According to exemplary embodiments of the present inventive concept, the third wirings 170 may include four metals. Alternatively, the third wirings 170 may include one to three metals or at least five metals.

The first to third wirings 150, 160 and 170 may include a power wiring, a signal wiring, and a ground wiring, etc. The first to third wirings 150, 160 and 170 may be extended in the insulating layer 120. The first to third wirings 150, 160 and 170 may extend over the pad 130. The first to third wirings 150, 160 and 170 may be electrically connected to each of the pad 130 and the circuit 140, for example, through via contacts.

The pad contact 180 may be configured to directly connect the pad 130 with the circuit 140. Thus, the pad contact 180 may be vertically extended from the pad 130 in a downward direction toward the circuit 140. Since the pad 130 may be directly connected to the circuit 140 via the pad contact 180, a power integrity and/or a signal integrity of the semiconductor device may be increased.

The first power supply 191 may supply a power to a first metal and a third metal included in the first wirings 150. The second power supply 192 may supply a power to a second metal and a fourth metal of the first wirings 150. The power supplied from the first power supply 191 may be different from the power supplied from the second power supply 192. For example, the power supplied from the first power supply 191 may be higher than the power supplied from the second power supply 192. Therefore, the first metal included in the first wirings 150, the second metal included in the first wirings 150, and a portion of the insulating layer 120 disposed between the first metal and the second metal included in the first wirings 150 may provide a horizontal metal-insulator-metal (MIM) capacitor.

The third power supply 193 may supply a power to a first metal and a third metal included in the second wirings 160. The fourth power supply 194 may supply a power to a second metal and a fourth metal of the second wirings 160. The power supplied from the third power supply 193 may be different from the power supplied from the fourth power supply 194. For example, the power supplied from the third power supply 193 may be higher than the power supplied from the fourth power supply 194. Therefore, the first metal included in the second wirings 160, the second metal included in the second wirings 160, and a portion of the insulating layer 120 disposed between the first metal and the second metal in the second wirings 160 may form a horizontal MIM capacitor.

Further, the power supplied from the first power supply 191 may be different from the power supplied from the third power supply 193. For example, the power supplied from the first power supply 191 may be higher than the power supplied from the third power supply 193. Therefore, the first metal included in the first wirings 150, the first metal included in the second wirings 160, and a portion of the insulating layer 120 disposed between the first metal in the first wirings 150 and the first metal included in the second wirings 160 may provide a vertical MIM capacitor.

The fifth power supply 195 may supply a power to a first metal and a third metal included in the third wirings 170. The sixth power supply 196 may supply a power to a second metal and a fourth metal included in the third wirings 170. The power supplied from the fifth power supply 195 may be different from the power supplied from the sixth power supply 196. For example, the power supplied from the fifth power supply 195 may be higher than the power supplied from the sixth power supply 196. Therefore, the first metal included in the third wirings 170, the second metal included in the third wirings 170, and a portion of the insulating layer 120 disposed between the first metal and the second metal included in the third wirings 170 may act as a horizontal MIM capacitor.

Further, the power supplied from the third power supply 193 may be different from the power supplied from the fifth power supply 195. For example, the power supplied from the third power supply 193 may be higher than the power supplied from the fifth power supply 195. Therefore, the first metal included in the second wirings 160, the first metal included in the third wirings 170, and a portion of the insulating layer 120 disposed between the first metal included in the second wirings 160 and the first metal included in the third wirings 170 may provide a vertical MIM capacitor.

Figure 4:
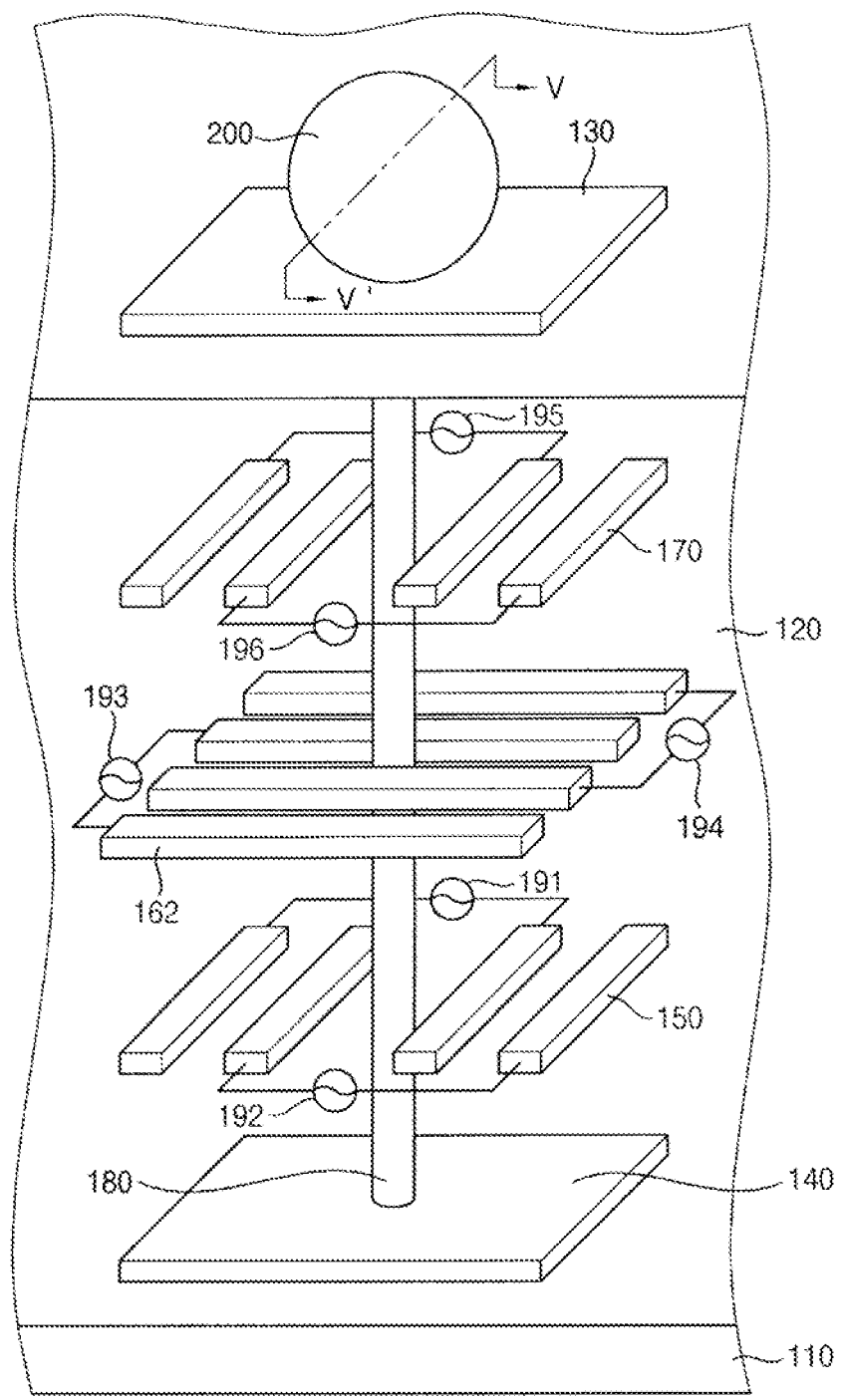
FIG. 4 is a perspective view illustrating a semiconductor device according to an exemplary embodiment of the present inventive concept.
Figure 5:
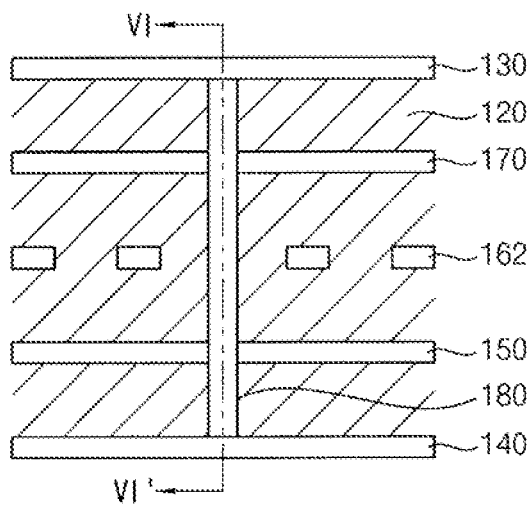
FIG. 5 is a cross-sectional view taken along a line V-V' of FIG. 4 according to an exemplary embodiment of the present inventive concept.
Figure 6:
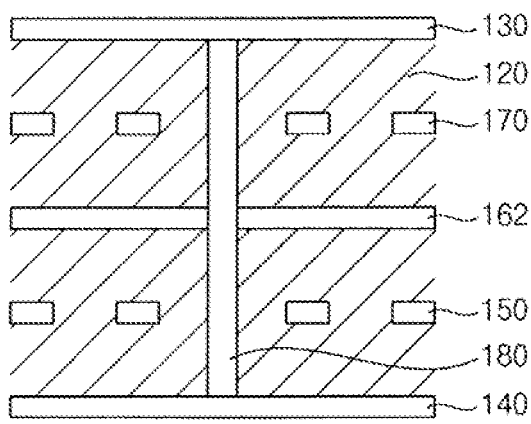
FIG. 6 is a cross-sectional view taken along a line VI-VI' of FIG. 5 according to an exemplary embodiment of the present inventive concept.

FIG. 4 is a perspective view illustrating a semiconductor device according to an exemplary embodiment of the present inventive concept. FIG. 5 is a cross-sectional view taken along a line V-V' of FIG. 4 according to an exemplary embodiment of the present inventive concept. FIG. 6 is a cross-sectional view taken along a line VI-VI' of FIG. 5 according to an exemplary embodiment of the present inventive concept.

A semiconductor device may include elements substantially the same as those of the semiconductor device described with reference to FIG. 1 except for second wirings. Thus, the same reference numerals may refer to the same elements and any further description with respect to the same elements may be omitted.

Referring to FIGS. 4 to 6, second wirings 162 may be extended in a direction substantially perpendicular to the first and third wirings 150 and 170.

Alternatively, the second wirings 162 may be inclined to the first and third wirings 150 and 170 at an acute angle.

Figure 7:
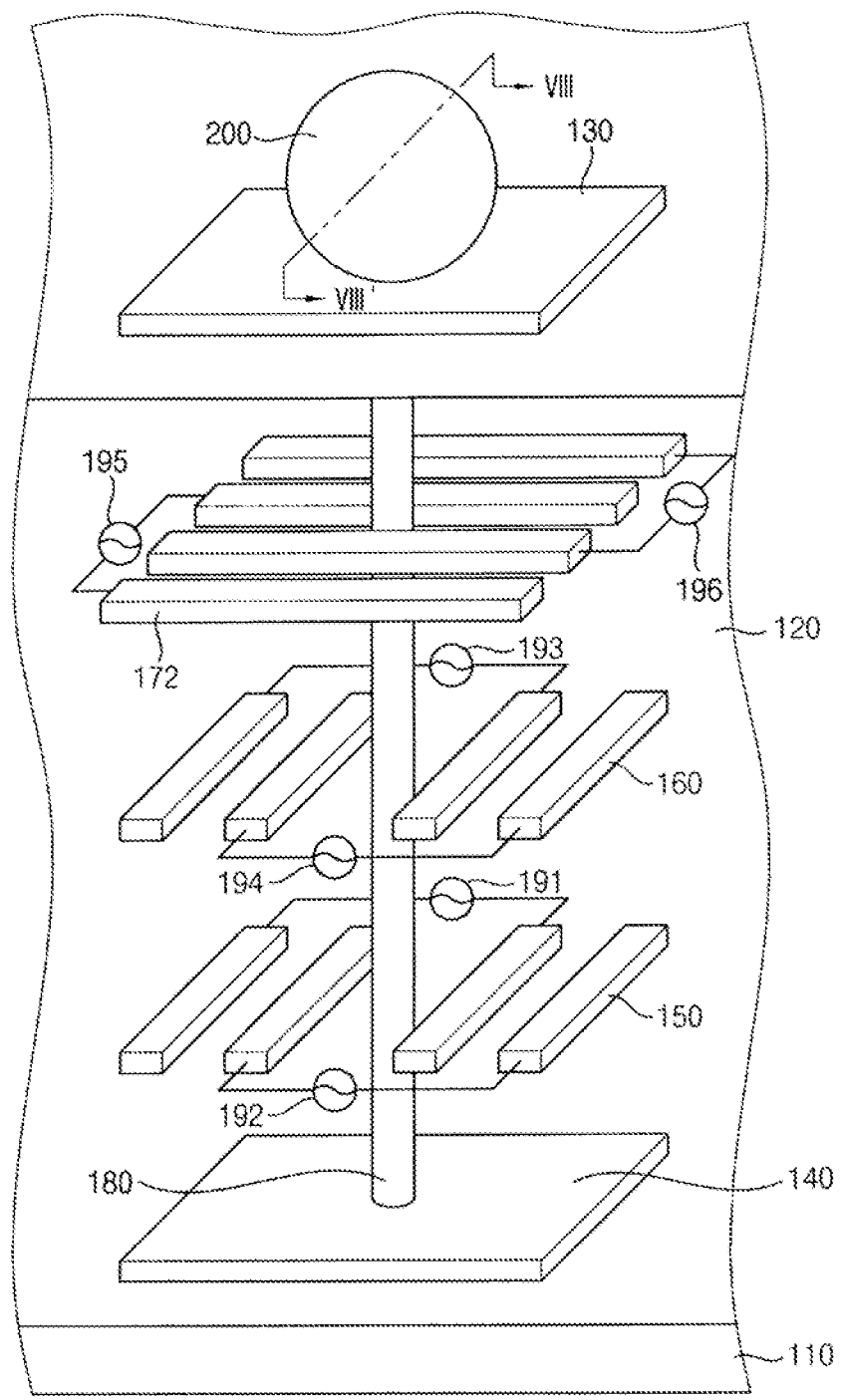
FIG. 7 is a perspective view illustrating a semiconductor device according to an exemplary embodiment of the present inventive concept
Figure 8:
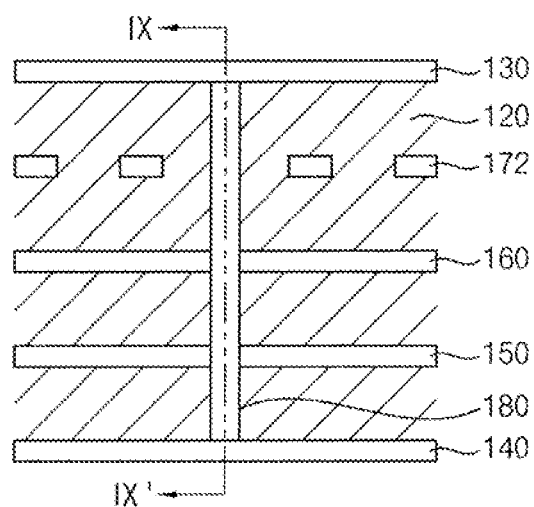
FIG. 8 is a cross-sectional view taken along a line VIII-VIII' of FIG. 7 according to an exemplary embodiment of the present inventive concept.

FIG. 7 is a perspective view illustrating a semiconductor device according to an exemplary embodiment of the present inventive concept. FIG. 8 is a cross-sectional view taken along a line VIII-VIII' of FIG. 7 according to an exemplary embodiment of the present inventive concept, and FIG. 9 is a cross-sectional view taken along a line IX-IX' of FIG. 8 according to an exemplary embodiment of the present inventive concept.

A semiconductor device may include elements substantially the same as those of the semiconductor device described with reference to FIG. 1 except for third wirings. Thus, the same reference numerals may refer to the same elements and any further description with respect to the same elements may be omitted.

Figure 9:
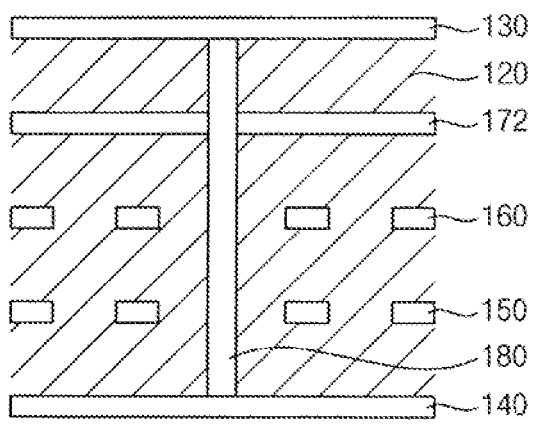
FIG. 9 is a cross-sectional view taken along a line IX-IX' of FIG. 8 according to an exemplary embodiment of the present inventive concept.

Referring to FIGS. 7 to 9, third wirings 172 may be extended in a direction substantially perpendicular to the first and third wirings 150 and 170.

Alternatively, the third wirings 172 may be inclined to the first and third wirings 150 and 170 at an acute angle.

Figure 10:
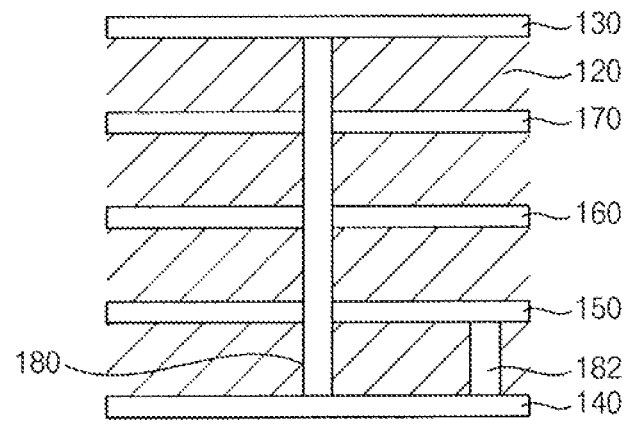
FIG. 10 is a perspective view illustrating a semiconductor device according to an exemplary embodiment of the present inventive concept.

FIG. 10 is a perspective view illustrating a semiconductor device according to an exemplary embodiment of the present inventive concept.

A semiconductor device may include elements substantially the same as those of the semiconductor device discussed with reference to FIG. 1 except for further including a first wiring contact. Thus, the same reference numerals may refer to the same elements and any further description with respect to the same elements may be omitted.

Referring to FIG. 10, a first wiring contact 182 may be configured to directly connect the first wirings 150 with the circuit 140. Thus, the first wiring contact 182 may be downwardly extended from the first wirings 150 toward the circuit 140.

The first wiring contact 182 may be included in the semiconductor device of FIG. 4 or the semiconductor device of FIG. 7.

Figure 11:
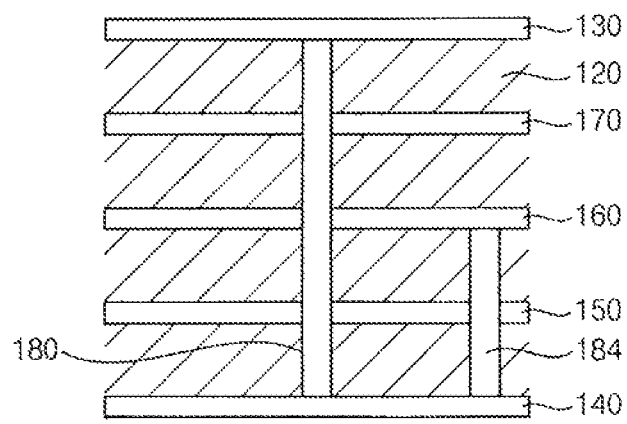
FIG. 11 is a perspective view illustrating a semiconductor device according to an exemplary embodiment of the present inventive concept.

FIG. 11 is a perspective view illustrating a semiconductor device according to an exemplary embodiment of the present inventive concept.

A semiconductor device may include elements substantially the same as those of the semiconductor device described with reference to FIG. 1 except for further including a second wiring contact. Thus, the same reference numerals may refer to the same elements and any further description with respect to the same elements may be omitted.

Referring to FIG. 11, a second wiring contact 184 may be configured to directly connect the second wirings 160 with the circuit 140. Thus, the second wiring contact 184 may be downwardly extended from the second wirings 160 toward the circuit 140.

The second wiring contact 184 may be included in the semiconductor device of FIG. 4, the semiconductor device of FIG. 7, or the semiconductor device of FIG. 10.

Figure 12:
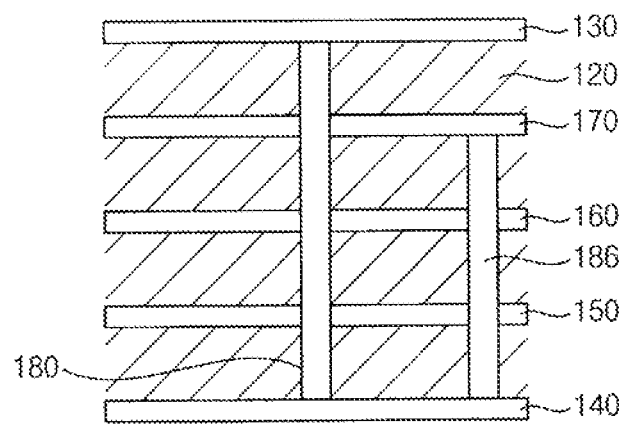
FIG. 12 is a perspective view illustrating a semiconductor device according to an exemplary embodiment of the present inventive concept.

FIG. 12 is a perspective view illustrating a semiconductor device according to an exemplary embodiment of the present inventive concept.

A semiconductor device may include elements substantially the same as those of the semiconductor device described with reference to FIG. 1 except for further including a third wiring contact. Thus, the same reference numerals may refer to the same elements and any further description with respect to the same elements may be omitted.

Referring to FIG. 12, a third wiring contact 186 may be configured to directly connect the third wirings 170 with the circuit 140. Thus, the third wiring contact 186 may be downwardly extended from the third wirings 170 toward the circuit 140.

The third wiring contact 186 may be included in the semiconductor device of FIG. 4, the semiconductor device of FIG. 7, the semiconductor device of FIG. 10, or the semiconductor device of FIG. 11.

Figure 13:
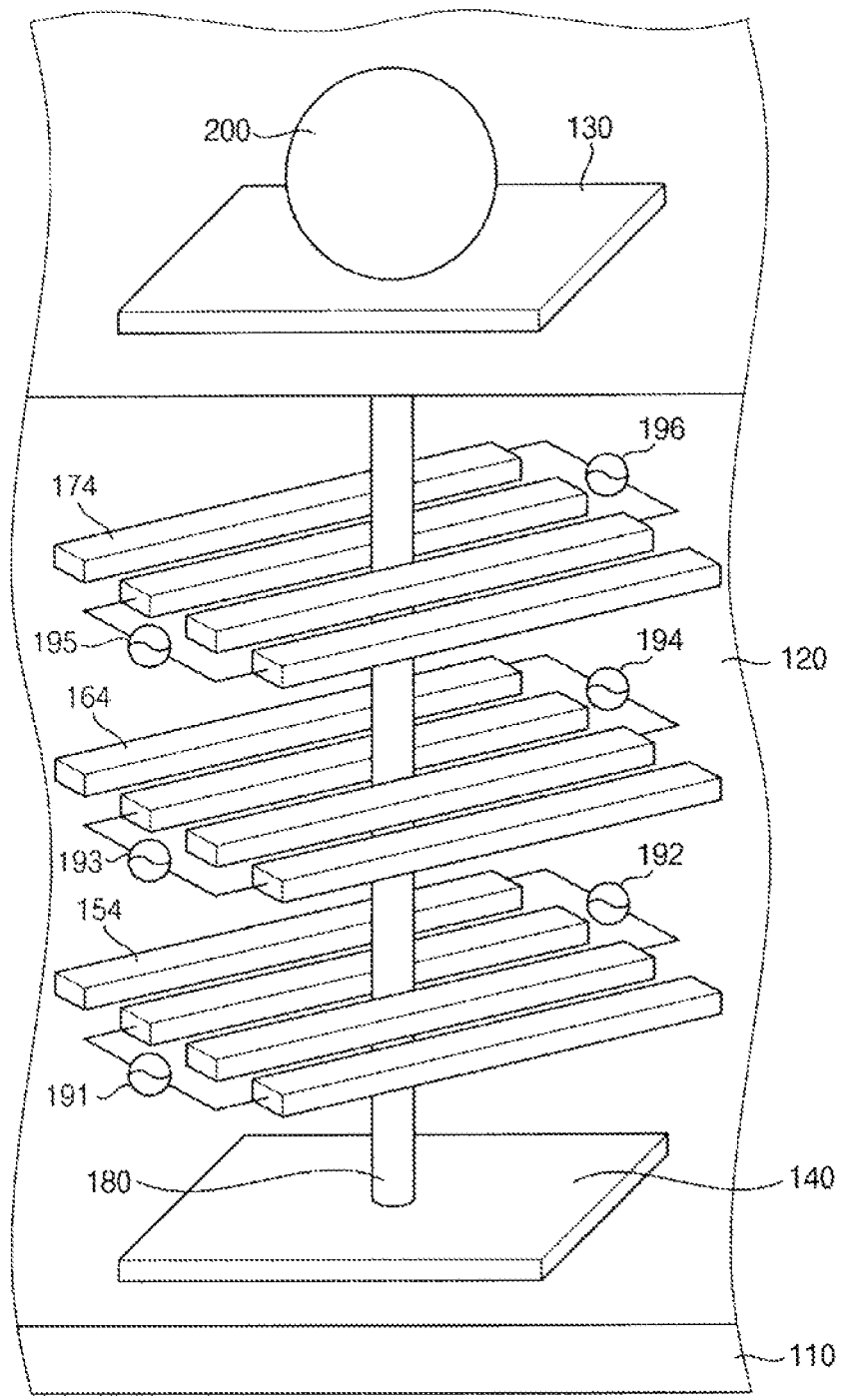
FIG. 13 is a perspective view illustrating a semiconductor device according to an exemplary embodiment of the present inventive concept.

FIG. 13 is a perspective view illustrating a semiconductor device according to an exemplary embodiment of the present inventive concept.

A semiconductor device may include elements substantially the same as those of the semiconductor device described with reference to FIG. 1 except for first to third wirings. Thus, the same reference numerals may refer to the same elements and any further description with respect to the same elements may be omitted herein.

Referring to FIG. 13, the first to third wirings 154, 164 and 174 may extend in a diagonal direction of the pad 130. According to an exemplary embodiment of the present inventive concept, the first to third wirings 154, 164 and 174 may extend in substantially the same direction. Alternatively, at least one of the first to third wirings 154, 164 and 174 may be substantially perpendicular to the other wirings.

The first to third wirings 154, 164 and 174 may be included in the semiconductor devices of FIGS. 10 to 12.

Figure 14:
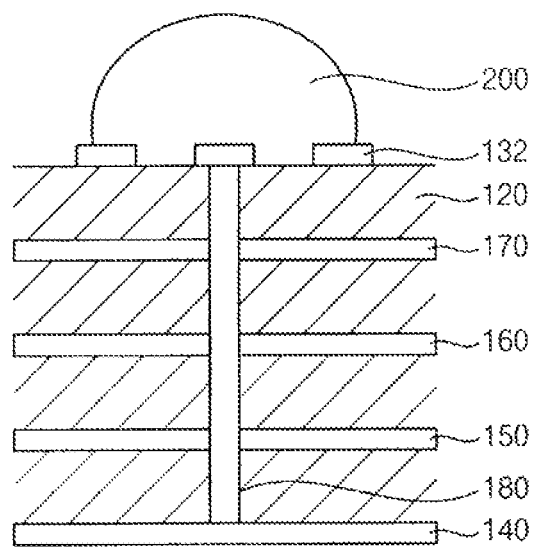
FIG. 14 is a perspective view illustrating a semiconductor device according to an exemplary embodiment of the present inventive concept.
Figure 15:
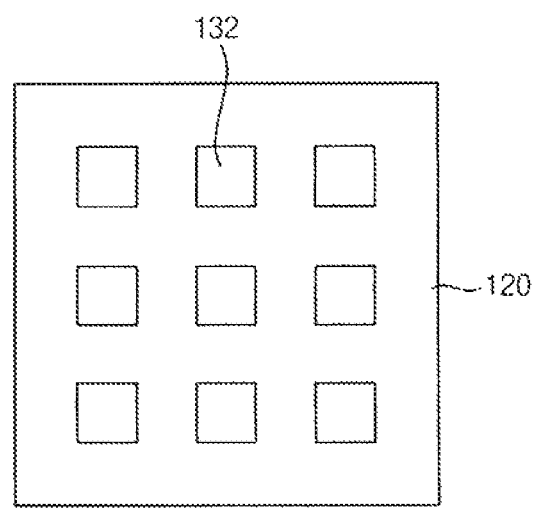
FIG. 15 is a plan view illustrating a pad of a semiconductor device of FIG. 14 according to an exemplary embodiment of the present inventive concept.

FIG. 14 is a perspective view illustrating a semiconductor device according to an exemplary embodiment of the present inventive concept. FIG. 15 is a plan view illustrating a pad of a semiconductor device of FIG. 14 according to an exemplary embodiment of the present inventive concept.

A semiconductor device may include elements substantially the same as those of the semiconductor device described with reference to FIG. 1 except for a pad. Thus, the same reference numerals may refer to the same elements and any further description with respect to the same elements may be omitted.

Referring to FIGS. 14 and 15, a dotted pad 132 may include a plurality of dots. The dotted pad 132 may be arranged in lengthwise and widthwise directions by, for example, a substantially same gap. Thus, the insulating layer 120 may be partially exposed through the dotted pad 132.

The conductive bump 200 may contact an upper surface and side surfaces of the dotted pad 132 and an exposed surface of the insulating layer 120. Thus, a contact area between the conductive bump 200 and the dotted pad 132 may be increased, for example, to reinforce a fixing force of the conductive bump 200.

The dotted pad 132 may be included in the semiconductor device of FIG. 4, the semiconductor device of FIG. 7, the semiconductor device of FIG. 10, the semiconductor device of FIG. 11, the semiconductor device of FIG. 12 or the semiconductor device of FIG. 13.

Figure 16:
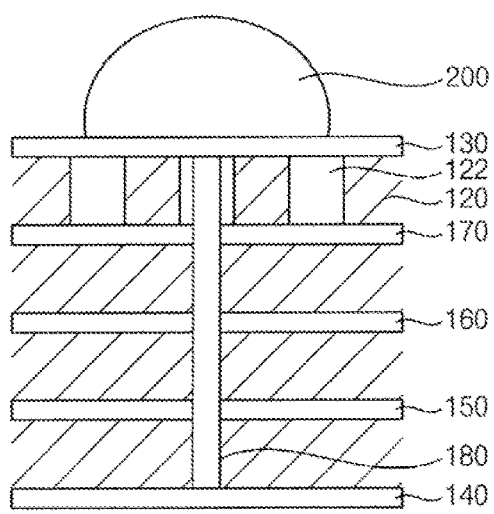
FIG. 16 is a perspective view illustrating a semiconductor device according to an exemplary embodiment of the present inventive concept.
Figure 17:
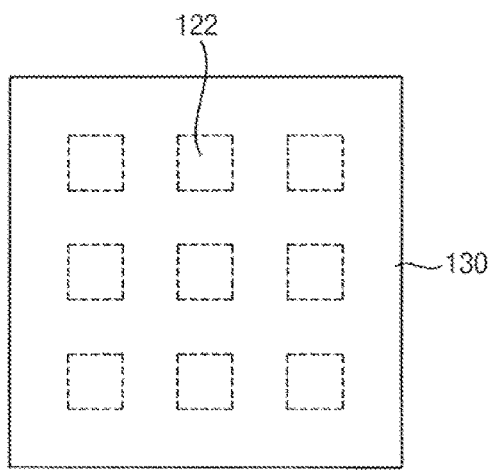
FIG. 17 is a plan view illustrating a pad of a semiconductor device of FIG. 16 according to an exemplary embodiment of the present invention.

FIG. 16 is a perspective view illustrating a semiconductor device according to an exemplary embodiment of the present inventive concept. FIG. 17 is a plan view illustrating a pad of a semiconductor device of FIG. 16 according to an exemplary embodiment of the present inventive concept.

A semiconductor device may include elements substantially the same as those of the semiconductor device described with reference to FIG. 1 except for an insulating layer. Thus, the same reference numerals may refer to the same elements and any further description with respect to the same elements may be omitted.

Referring to FIGS. 16 and 17, a plurality of air cushions 122 may be formed in the insulating layer 120. The air cushions 122 may be formed in portions of the insulating layer 120, for example, between the pad 130 and the third wirings 170.

When the conductive bump 200 is disposed on the pad 130, the pad 130 may inwardly bend into the air cushions 122. Thus, a contact area between the conductive bump 200 and the pad 130 may be increased, for example, to reinforce a fixing force of the conductive bump 200.

The air cushions 122 may be included in the semiconductor device of FIG. 4, the semiconductor device of FIG. 7, the semiconductor device of FIG. 10, the semiconductor device of FIG. 11, the semiconductor device of FIG. 12, or the semiconductor device of FIG. 13.

According to an exemplary embodiment of the present inventive concept, the first to third wirings may be positioned in the insulating layer below the pad by removing a ring pattern configured to surround the pad. Thus, the semiconductor device may have a relatively small size. Further, the pad may be directly connected to the circuit through the pad contact. Furthermore, the first and third wirings may be configured to form the MIM capacitor using the insulating layer disposed between the first and third wirings. Therefore, the semiconductor device may have an increased power integrity and increased signal integrity.

The foregoing is illustrative of exemplary embodiments of the present inventive concept and is not to be construed as limiting thereof. Although a few exemplary embodiments have been described herein, those skilled in the art will readily appreciate that many modifications are possible in the exemplary embodiments without materially departing from the spirit and scope of the present inventive concept as defined by the following claims.

What is claimed is:

1. A semiconductor device, comprising:
an insulating layer;
a pad disposed on the insulating layer;
a circuit disposed in the insulating layer below the pad;
first wirings disposed between the pad and the circuit;
second wirings disposed between the pad and the first wirings;
third wirings disposed between the pad and the second wirings; and
a first power supply that supplies power to the first to third wirings;
a second power supply and a third power supply that supply power to the first to second wirings,
wherein the power supplied from the second power supply differs from the power supplied from the first power supply, and the power supplied from the third power supply differs from the power supplied from the first power supply.

2. The semiconductor device of claim 1, wherein the first to third wirings are electrically connected to each of the pad and the circuit.

3. The semiconductor device of claim 1, wherein the power supplied from the second power supply is higher than the power supplied from the first power supply.

4. The semiconductor device of claim 3, wherein the power supplied by the third power supply is higher than the power supplied from the first power supply.

5. The semiconductor device of claim 4, wherein the pad comprises a plurality of dots.

6. A semiconductor device, comprising:
a substrate;
an insulating layer disposed over the substrate;
a pad disposed on the insulating layer;
a circuit disposed on the substrate and spaced apart from the pad;
first wirings disposed between the pad and the circuit;
second wirings disposed between the pad and the first wirings;
third wirings disposed between the pad and the second wirings; and
a first power supply that supplies power to the first to the third wirings;
a second power supply that supplies power to the first to the second wirings; and
a third power supply that supplies power to the third wirings,
wherein the power supplied from the second power supply differs from the power supplied from the first power supply, and the power supplied from the third power supply differs from the power supplied from the first power supply.

7. The semiconductor device of claim 6, wherein the first to third wirings are electrically connected to each of the pad and the circuit.

8. The semiconductor device of claim 6, wherein the power supplied from the second power supply is higher than the power supplied from the first power supply.

9. The semiconductor device of claim 7, wherein the power supplied from the third power supply is higher than the power supplied from the first power supply.

10. The semiconductor device of claim 9, wherein the pad comprises a plurality of dots.

11. A semiconductor device, comprising:
a substrate;
an insulating layer disposed over the substrate;
a pad disposed on the insulating layer;
a circuit disposed on the substrate and spaced apart from the pad;
first wirings disposed between the pad and the circuit;
second wirings disposed between the pad and the first wirings;
third wirings disposed between the pad and the second wirings; and
a first power supply and second power supply that supply power to the first to the second wirings; and a third power supply that supplies power to the third wirings, wherein the power supplied from the first power supply differs from the power supplied from the third power supply, and the power supplied from the second power supply differs from the power supplied from the third power supply.

12. The semiconductor device of claim 11, wherein the first to third wirings are electrically connected to each of the pad and the circuit.

13. The semiconductor device of claim 12, wherein the pad comprises a plurality of dots.

* * * * *